(12) United States Patent
Kang et al.

(10) Patent No.: US 8,482,018 B2
(45) Date of Patent: Jul. 9, 2013

(54) LIGHT EMITTING DEVICE AND METHOD FOR FABRICATING THE SAME

(75) Inventors: Bong Cheol Kang, Seoul (KR); Duk Kyu Bae, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 390 days.

(21) Appl. No.: 12/681,540

(22) PCT Filed: Oct. 2, 2008

(86) PCT No.: PCT/KR2008/005839
§ 371 (c)(1),
(2), (4) Date: Apr. 2, 2010

(87) PCT Pub. No.: WO2009/045082
PCT Pub. Date: Apr. 9, 2009

(65) Prior Publication Data
US 2010/0237371 A1 Sep. 23, 2010

(30) Foreign Application Priority Data
Oct. 4, 2007 (KR) .................. 10-2007-0099909

(51) Int. Cl.
*H01L 33/00* (2010.01)
(52) U.S. Cl.
USPC ........ 257/98; 257/89; 257/104; 257/E21.211; 257/E21.596; 257/E33.056
(58) Field of Classification Search
USPC ............. 438/28, 29, 63, 110, 113, 151, 158, 438/479; 257/76, 79, 89, 98–104, E21.211, 257/596–599, 33.003–33.006, 12, 56, 62–67, 257/75, 13, E33.008
See application file for complete search history.

(56) References Cited

U.S. PATENT DOCUMENTS

| | | | | |
|---|---|---|---|---|
| 7,292,614 B2 * | 11/2007 | Cok et al. | ................ | 372/43.01 |
| 7,372,078 B2 * | 5/2008 | Jang et al. | ................ | 257/98 |
| 7,768,025 B2 * | 8/2010 | Jang et al. | ................ | 257/98 |
| 8,093,109 B2 * | 1/2012 | Hirata et al. | ................ | 438/151 |
| 8,124,454 B1 * | 2/2012 | Chu et al. | ................ | 438/110 |
| 2007/0114552 A1 | 5/2007 | Jang et al. | | |
| 2008/0023691 A1 * | 1/2008 | Jang et al. | ................ | 257/13 |
| 2008/0142814 A1 * | 6/2008 | Chu et al. | ................ | 257/79 |
| 2008/0308820 A1 * | 12/2008 | Louwsma et al. | ................ | 257/89 |
| 2009/0072259 A1 * | 3/2009 | Chen et al. | ................ | 257/98 |
| 2009/0250712 A1 * | 10/2009 | Xuan | ................ | 257/94 |
| 2010/0201280 A1 * | 8/2010 | McKenzie et al. | ................ | 315/246 |
| 2010/0244085 A1 * | 9/2010 | Xuan et al. | ................ | 257/99 |
| 2011/0003416 A1 * | 1/2011 | Jang et al. | ................ | 438/29 |

(Continued)

FOREIGN PATENT DOCUMENTS

| | | |
|---|---|---|
| JP | 2007-200995 A | 8/2007 |
| KR | 10-0617873 B1 | 8/2006 |
| KR | 10-0640496 B1 | 10/2006 |
| KR | 10-2007-0056585 A | 6/2007 |

*Primary Examiner* — Michael Lebentritt
(74) *Attorney, Agent, or Firm* — Birch, Stewart, Kolasch & Birch, LLP

(57) ABSTRACT

Disclosed is a light emitting device. The light emitting device comprises a light emitting semiconductor layer comprising a first conductive semiconductor layer, an active layer and a second conductive semiconductor layer, a second electrode layer supporting the light emitting semiconductor layer while surrounding the light emitting semiconductor layer, and a first passivation layer between a side of the light emitting semiconductor layer and the second electrode layer.

21 Claims, 4 Drawing Sheets

U.S. PATENT DOCUMENTS

| | | | |
|---|---|---|---|
| 2011/0114984 A1* | 5/2011 | Seong | 257/98 |
| 2011/0143466 A1* | 6/2011 | Chen et al. | 438/29 |
| 2011/0260196 A1* | 10/2011 | Okagawa et al. | 257/98 |
| 2012/0018700 A1* | 1/2012 | Jang et al. | 257/13 |
| 2012/0032184 A1* | 2/2012 | Tran et al. | 257/76 |
| 2012/0032218 A1* | 2/2012 | Choi et al. | 257/98 |

* cited by examiner

LIGHT EMITTING DEVICE AND METHOD FOR FABRICATING THE SAME

LIGHT EMITTING DEVICE AND METHOD FOR FABRICATING THE SAME

TECHNICAL FIELD

The present disclosure relates to a light emitting device and a method for fabricating the same.

BACKGROUND ART

An LED (light emitting diode) is a semiconductor light emitting device for converting electric current into light.

Wavelength of light emitted from such an LED varies depending on semiconductor material used for the LED. This is because the wavelength of the light varies depending on a bandgap of the semiconductor material, which represents energy gap between valence band electrons and conduction band electrons.

Recently, as luminance of the LED is gradually increased, the LED has been used as a light source for a display apparatus, illumination and a light source for a vehicle. An LED emitting white light with superior efficiency can be achieved by using fluorescent material or combining LEDs representing various colors.

DISCLOSURE OF INVENTION

Technical Problem

The embodiment provides a light emitting device, and a method for fabricating the same.

The embodiment provides a light emitting device having improved light extraction efficiency, and a method for fabricating the same.

The embodiment provides a light emitting device having improved insulating characteristics, and a method for fabricating the same.

The embodiment provides a light emitting device having improved thermal stability and physical characteristics, and a method for fabricating the same.

Technical Solution

In an embodiment, a light emitting device comprises a light emitting semiconductor layer comprising a first conductive semiconductor layer, an active layer and a second conductive semiconductor layer, a second electrode layer supporting the light emitting semiconductor layer while surrounding the light emitting semiconductor layer, and a first passivation layer between a side of the light emitting semiconductor layer and the second electrode layer.

In an embodiment, a light emitting device comprises a light emitting semiconductor layer comprising a first conductive semiconductor layer, an active layer and a second conductive semiconductor layer, a first passivation layer at a side of the light emitting semiconductor layer, a metal layer under the light emitting semiconductor layer and the first passivation layer and at side of the first passivation layer, a second passivation layer at a side of the metal layer, and a support layer under the second passivation layer and at a side of the second passivation layer while supporting the light emitting semiconductor layer.

In an embodiment, a method for fabricating a light emitting device, the method comprises the steps of forming a light emitting semiconductor layer comprising a first conductive semiconductor layer, an active layer and a second conductive semiconductor layer on a substrate, forming a first passivation layer at a side and an upper edge of the light emitting semiconductor layer to expose an upper center portion of the light emitting semiconductor layer, forming a metal layer on the light emitting semiconductor layer and the first passivation layer and at sides of the first passivation layer, forming a support layer on the metal and at a side of the metal layer, and removing the substrate and forming an electrode layer on the light emitting semiconductor layer.

Advantageous Effects

The embodiment can provide a light emitting device having improved light extraction efficiency, and a method for fabricating the same.

The embodiment can provide a light emitting device having improved insulating characteristics, and a method for fabricating the same.

The embodiment can provide a light emitting device having improved thermal stability and physical characteristics, and a method for fabricating the same.

MODE FOR THE INVENTION

Figure 1:
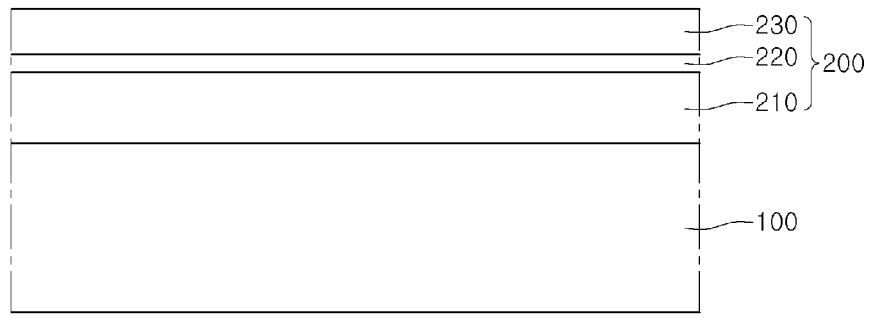
FIGS. 1 to 6 are sectional views illustrating a light emitting device and a method for fabricating the same according to a first embodiment.

An embodiment according to the present invention will be described in detail with reference to the accompanying drawings.

The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

The same reference numerals are used to designate the same elements throughout the drawings. In the drawings, the sizes and relative sizes of layers and regions may be exaggerated for clarity.

It will be understood that when an element such as a layer, a region or a substrate is referred to as being "on" or "under" another element, it can be directly on or under the other element or intervening elements may be present. When a part of an element such as a surface is referred to as a term "inner", it will be understood that the part is far away from a device as compared with other parts of the element.

It will be understood that such terms include other directions of the device in addition to the directions shown in the drawings. Last, when an element is referred to as being "directly on" another element, there are no intervening elements present. As used herein, the term "and/or" includes any and all combinations of one or more of the associated listed items.

FIGS. 1 to 6 are sectional views illustrating a light emitting device and a method for fabricating the same according to a first embodiment.

Figure 5:
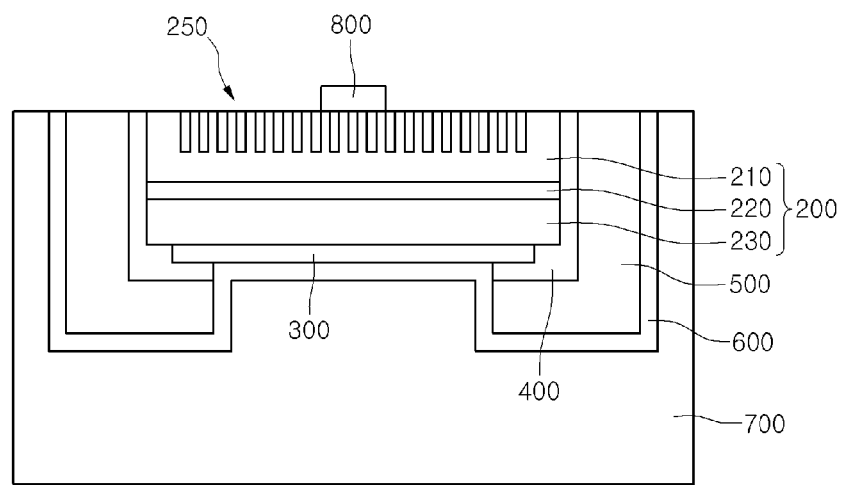

First, referring to FIG. 5, the light emitting device according to the first embodiment includes a second electrode layer having a support layer 700, a bonding metal layer 600 formed on the support layer 700, and an ohmic contact layer 300 formed on the bonding metal layer 600.

A light emitting semiconductor layer 200 including a second conductive semiconductor layer 230, an active layer 220 and a first conductive semiconductor layer 210 is formed on the ohmic contact layer 300. A first electrode layer 800 is formed on the first conductive semiconductor layer 210.

Further, first and second passivation layers 400 and 500 are formed between the light emitting semiconductor layer 200 and the bonding metal layer 600.

The support layer 700 has a center portion protruding toward the light emitting semiconductor layer 200 while surrounding the side of the light emitting semiconductor layer 200. The bonding metal layer 600 is formed on the support layer 700.

Thus, the first and second passivation layers 400 and 500, the bonding metal layer 600, and the support layer 700 are disposed at the side of the light emitting semiconductor layer 200.

The first and second passivation layers 400 and 500 allow the side of the light emitting semiconductor layer 200 to be electrically isolated from the bonding metal layer 600 and the support layer 700. In detail, the active layer 220 and the first conductive semiconductor layer 210 can be electrically isolated from the bonding metal layer 600 and the support layer 700 by the first and second passivation layers 400 and 500.

Hereinafter, the light emitting device and the method for fabricating the same according to the first embodiment of the present invention will be described in detail with reference to FIGS. 1 to 6.

Referring to FIG. 1, the light emitting semiconductor layer 200 having a multilayer is formed on a substrate 100. The light emitting semiconductor layer 200 includes the first conductive semiconductor layer 210, the active layer 220 and the second conductive semiconductor layer 230. The light emitting semiconductor layer 200 may include a gallium nitride-based semiconductor layer.

Figure 2:
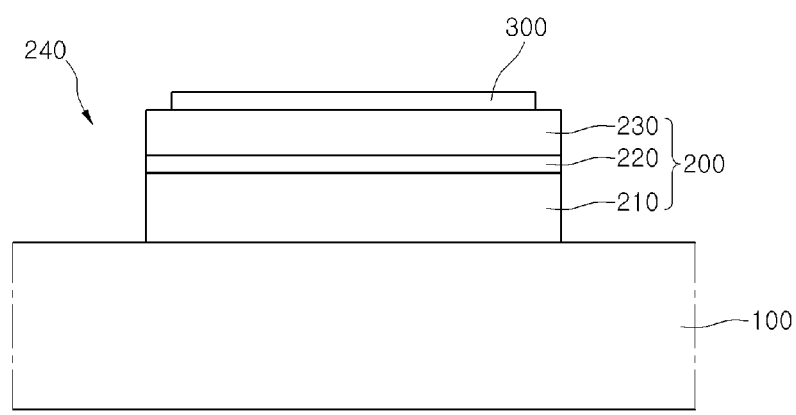

Referring to FIG. 2, in order to fabricate a plurality of light emitting devices by dividing the light emitting semiconductor layer 200 on the substrate 100, a unit division area 240 is etched and the ohmic contact layer 300 is formed on the second conductive semiconductor layer 230. The ohmic contact layer 300 may include a metal electrode layer or a transparent electrode layer. For example, the ohmic contact layer 300 may include at least one of ITO, ZnO, $RuO_x$, $TiO_x$, or $IrO_x$.

Figure 3:
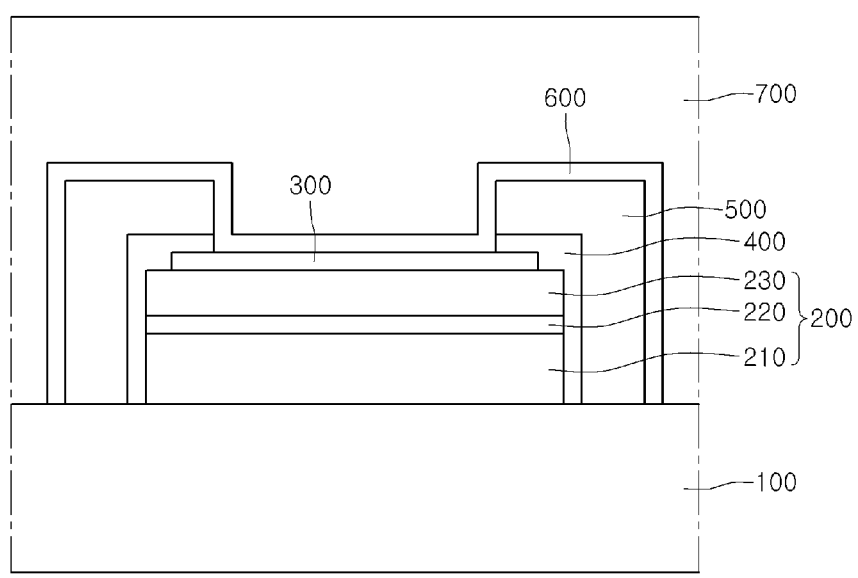

Referring to FIG. 3, in a state in which the ohmic contact layer 300 is formed, the first passivation layer 400 is formed to cover the lateral side of the light emitting semiconductor layer 200. The first passivation layer 400 covers a part (i.e. a peripheral portion) of the upper surface of the light emitting semiconductor layer 200. Further, the first passivation layer 400 may cover a part of the upper surface of the ohmic contact layer 300.

The first passivation layer 400 includes an inorganic layer and may include material containing at least one of Si, N, Ti, or O. The first passivation layer 400 may use an SOG (spin on glass). For example, the first passivation layer 400 may include one of SiN, $SiO_2$, or $TiO_2$.

When the first passivation layer 400 uses the SiN, the first passivation layer 400 may have thickness of about 1000 Å or more, or about 1 μm.

Figure 4:
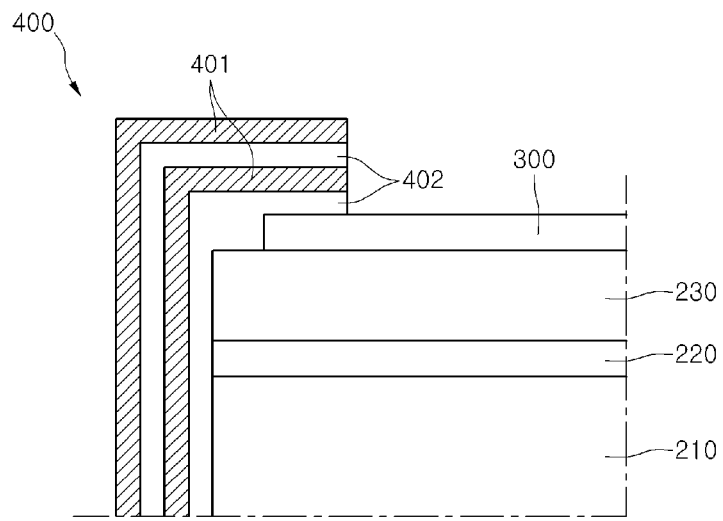

Referring to FIG. 4, the first passivation layer 400 includes at least two first and second inorganic layers 401 and 402 alternately disposed. For example, the first inorganic layer 401 may include $SiO_2$ and the second inorganic layer 402 may include $TiO_2$. As described above, the first and second inorganic layers 401 and 402 are alternately formed, so that the structural stability can be improved and reflection characteristics can be improved using the difference between refractive indices of the first and second inorganic layers 401 and 402.

Referring again to FIG. 3, the second passivation layer 500 is formed at the lateral side and on an upper surface of the first passivation layer 400.

The second passivation layer 500 includes an organic layer and can be formed with high molecular substance containing carbon C or oxygen O. For example, the second passivation layer 500 includes at least one of acryl-based material, epoxy-based material, or polyimide-based material.

The second passivation layer 500 may have thickness thicker than that of the first passivation layer 400, and a ratio of the thickness of the second passivation layer 500 to the thickness of the first passivation layer 400 may be 1:5 or 1:100. For example, the ratio of the thickness of the second passivation layer 500 to the thickness of the first passivation layer 400 may be selected from the range of 1:25 to 1:50.

As described above, the dual structure of the first and second passivation layers 400 and 500 can improve the thermal stability and mechanical properties of the passivation layers.

The first and second passivation layers 400 and 500 mist have predetermined elastic coefficients, fracture strength and tensile strength as well as superior thermal stability in order to support and protect the light emitting device when the light emitting device is separated from the substrate 100.

An inorganic layer may have large tensile strength and fracture strength but may be weak against stress. An organic layer may be strong against stress due to high viscosity thereof but may have low thermal stability. For example, since the organic layer may be damaged if the organic layer is maintained for 72 hours at the temperature of about 150° C., the inorganic layer is formed to prevent the organic layer from being damaged due to heat.

Thus, according to the embodiment, the first passivation layer 400 using an inorganic layer and the second passivation layer 500 using an organic layer are formed, so that leakage current can be prevented and the structural stability can be improved.

Meanwhile, after the first and second passivation layers 400 and 500 are formed, the bonding metal layer 600 and the support layer 700 are formed.

The bonding metal layer 600 covers the lateral sides and upper surfaces of the ohmic contact layer 300 and the second passivation layer 500, and the support layer 700 covers the lateral side and upper surface of the bonding metal layer 600.

The bonding metal layer 600 may include metal containing at least one of Ag, Cu, Ni, or Al, and the support layer 700 may include conductive material.

For example, the support layer 700 may be plated with metal such as Ti, Cr, Ni, Al, Pt, Au and W. Further, such metal may be plated or attached to the bonding metal layer 600 or a conductive substrate such as a wafer containing impurities may be attached to the bonding metal layer 600 as the supporting layer 700.

Referring to FIG. 5, after the support layer 700 is formed, the substrate 100 is removed. FIG. 5 is a sectional view in which the light emitting device in FIG. 3 is turned over.

As the substrate 100 is removed, the first conductive semiconductor layer 210 is exposed upward.

Then, the first electrode layer 800 is formed on the first conductive semiconductor layer 210, and a light extraction structure 250 having a hole shape or a column shape, such as photonic crystal, is formed in the first conductive semiconductor layer 210. Light generated from the active layer 220 can be efficiently emitted to the outside by the light extraction structure 250.

Figure 6:
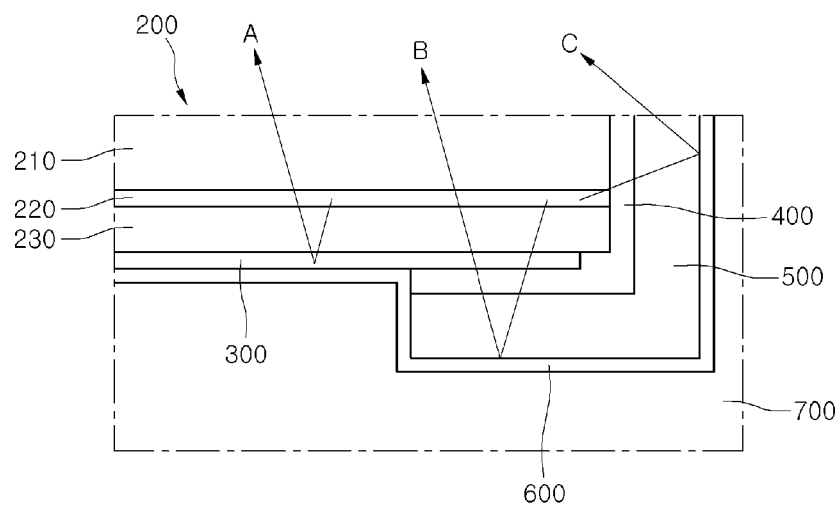

Referring to FIG. 6, a part of the light generated from the active layer 220 of the light emitting semiconductor layer 200 is emitted upward by passing through the first conductive semiconductor layer 210, and a remaining part of the light is emitted sideward and downward as indicated by arrows A, B and C.

Then, the light A, B and C emitted sideward and downward is reflected by the ohmic contact layer 300 or the bonding metal layer 600 and emitted upward.

FIGS. 7 to 10 are sectional views illustrating a light emitting device and a method for fabricating the same according to a second embodiment.

Figure 9:
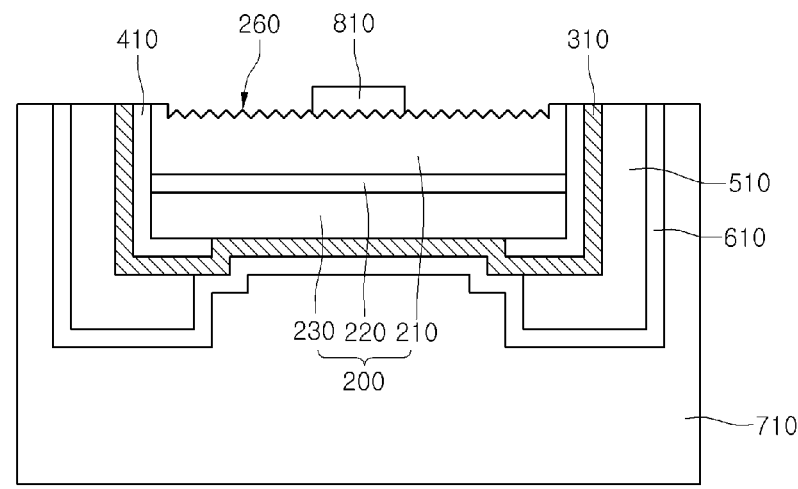

First, referring to FIG. 9, the light emitting device according to the second embodiment includes a second electrode layer having a support layer 710, a bonding metal layer 610 formed on the support layer 710, and a metal layer 310 formed on the bonding metal layer 610.

A light emitting semiconductor layer 200 including a second conductive semiconductor layer 230, an active layer 220 and a first conductive semiconductor layer 210 is formed on the metal layer 310. A first electrode layer 810 is formed on the first conductive semiconductor layer 210.

The lower center portion of the second conductive semiconductor layer 230 makes contact with the metal layer 310, and a first passivation layer 410 is formed at the lower edge and lateral side of the light emitting semiconductor layer 200 to allow the metal layer 310 to be electrically isolated from the light emitting semiconductor layer 200.

The lower center portion of the metal layer 310 makes contact with the bonding metal layer 610, and a second passivation layer 510 is formed at the edge and lateral side of the metal layer 310.

The support layer 710 has a center portion that protrudes toward the light emitting semiconductor layer 200 while surrounding the lateral side of the light emitting semiconductor layer 200. The bonding metal layer 610 is formed on the support layer 710.

Thus, the first passivation layer 410, the metal layer 310, the second passivation layer 510, the bonding metal layer 610 and the support layer 710 are disposed at the side of the light emitting semiconductor layer 200.

The first passivation layer 410 allows the lateral side of the light emitting semiconductor layer 200 to be electrically isolated from the metal layer 310. In detail, the active layer 220 and the first conductive semiconductor layer 210 can be electrically isolated from the metal layer 310 by the first passivation layer 410.

Hereinafter, the light emitting device and the method for fabricating the same according to the second embodiment of the present invention will be described in detail with reference to FIGS. 7 to 10.

Figure 7:
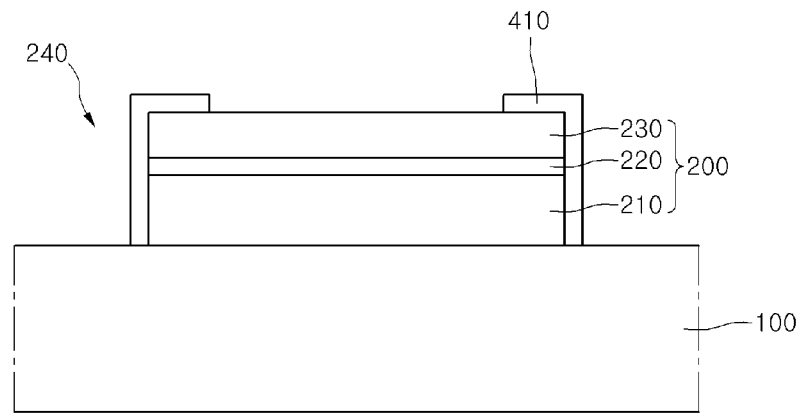
FIGS. 7 to 10 are sectional views illustrating a light emitting device and a method for fabricating the same according to a second embodiment.

Referring to FIG. 7, the light emitting semiconductor layer 200 having a multilayer is formed on a substrate 100. The light emitting semiconductor layer 200 includes the first conductive semiconductor layer 210, the active layer 220 and the second conductive semiconductor layer 230. The light emitting semiconductor layer 200 may include a gallium nitride-based semiconductor layer.

In order to fabricate a plurality of light emitting devices by dividing the light emitting semiconductor layer 200 on the substrate 100, a unit division area 240 is etched and the first passivation layer 410 is formed at the lateral side and on an upper edge of the light emitting semiconductor layer 200.

The first passivation layer 410 includes an inorganic layer and may include material containing at least one of Si, N, Ti, or O. The first passivation layer 410 may use an SOG. For example, the first passivation layer 410 may include one of SiN, $SiO_2$, or $TiO_2$.

When the first passivation layer 410 uses the SiN, the first passivation layer 410 may have thickness of about 1000 Å or more, or about 1 μm.

As described in FIG. 4 of the first embodiment, the first passivation layer 410 may include at least two first and second inorganic layers alternately disposed. For example, the first inorganic layer may include $SiO_2$ and the second inorganic layer may include $TiO_2$. As described above, the first and second inorganic layers are alternately formed, so that the structural stability can be improved and reflection characteristics can be improved using the difference between refractive indices of the first and second inorganic layers.

Figure 8:
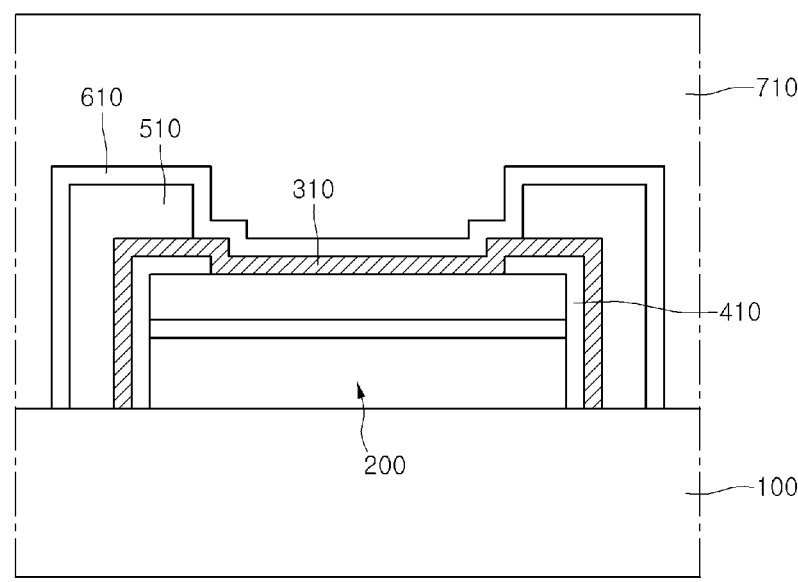

Referring to FIG. 8, the metal layer 310 is formed to cover the first passivation layer 400 and the light emitting semiconductor layer 200. The metal layer 310 may include a reflective ohmic electrode layer having high reflectivity and makes contact with the upper center portion of the light emitting semiconductor layer 200.

For example, the metal layer 310 may include metal containing at least one of Ag, W, or Al.

In a state in which the metal layer 310 is formed, a second passivation layer 510 is formed to cover the side of the metal layer 310. In detail, the second passivation layer 510 covers a part (i.e. a peripheral portion) of the upper surface of the metal layer 310.

The second passivation layer 510 includes an organic layer and can be formed with high molecular substance containing carbon C or oxygen O. For example, the second passivation layer 510 includes at least one of acryl-based material, epoxy-based material, or polyimide-based material.

The second passivation layer 510 may have thickness thicker than that of the first passivation layer 410, and a ratio of the thickness of the second passivation layer 510 to the thickness of the first passivation layer 410 may be 1:5 or 1:100. For example, the ratio of the thickness of the second passivation layer 510 to the thickness of the first passivation layer 410 may be selected from the range of 1:25 to 1:50.

The second passivation layer 510 using an organic layer serves as a stress buffer having resistance against stress and the first passivation layer 410 using an inorganic layer improves the insulation, heat resistance and light extraction characteristics.

After the second passivation layer 510 is formed, the bonding metal layer 610 and the support layer 710 are formed.

The bonding metal layer 610 covers the metal layer 310 and the second passivation layer 510, and the support layer 710 covers the lateral side and upper surface of the bonding metal layer 610.

The bonding metal layer 610 may include metal containing at least one of Ag, Cu, Ni, or Al, and the support layer 710 may include conductive material.

For example, the support layer 710 may be plated with metal such as Ti, Cr, Ni, Al, Pt, Au and W. Further, such metal may be plated or attached to the bonding metal layer 610 or a conductive substrate such as a wafer containing impurities may be attached to the bonding metal layer 610 as the support layer 710.

Referring to FIG. 9, after the support layer 710 is formed, the substrate 100 is removed. FIG. 9 is a sectional view in which the light emitting device in FIG. 8 is turned over.

As the substrate 100 is removed, the first conductive semiconductor layer 210 is exposed upward.

Then, the first electrode layer 810 is formed on the first conductive semiconductor layer 210, and a light extraction structure 260 having a hole or column shape, such as photonic crystal, is formed in the first conductive semiconductor layer 210. Light generated from the active layer 220 can be efficiently emitted to the outside by the light extraction structure 260.

The light emitting semiconductor layer 200 may have thickness of 7 μm to 8 μm to have resistance against stress, and a ratio of thickness of the first conductive semiconductor layer 210 including the light extraction structure 260 to thickness of the light extraction structure 260 may be 1:1.5 to 1:10.

Figure 10:
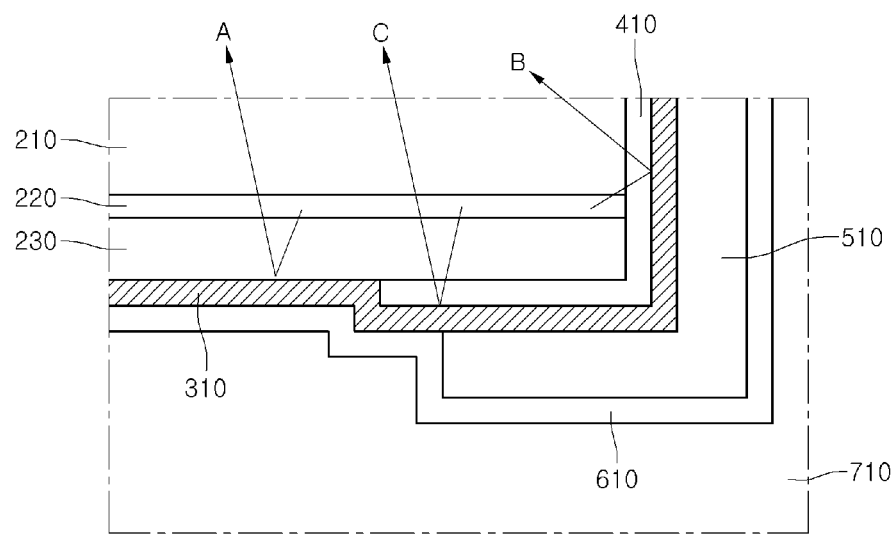

Referring to FIG. 10, a part of the light generated from the active layer 220 of the light emitting semiconductor layer 200 is emitted upward by passing through the first conductive semiconductor layer 210, and a remaining part of the light is emitted sideward and downward as indicated by arrows A, B and C.

Then, the light A, B and C emitted sideward and downward is reflected by the metal layer 310 and emitted upward.

Meanwhile, when comparing FIG. 6 with FIG. 10, the light B and C generated from the active layer 220 is reflected by the bonding metal layer 600 by passing through the first and second passivation layers 400 and 500 in FIG. 6. However, in FIG. 10, the light B and C generated from the active layer 220 is reflected by the metal layer 310 by passing through the first passivation layer 410.

In detail, according to the light emitting device of the second embodiment, the light emitted from the active layer 220 is reflected after passing through only the first passivation layer 410 including the inorganic layer. Since an organic layer has relative low light transmittance and high light absorption as compared with an inorganic layer, light can be prevented from being absorbed by the organic layer and thus light loss can be prevented according to the light emitting device of the second embodiment.

INDUSTRIAL APPLICABILITY

The embodiment can be applied to a light emitting device uses as a light source for an illumination apparatus and an electronic apparatus and a method for fabricating the same.

The invention claimed is:

1. A light emitting device comprising:
   a light emitting semiconductor layer comprising a first conductive semiconductor layer, an active layer and a second conductive semiconductor layer;
   a first electrode layer on the light emitting semiconductor layer;
   a second electrode layer supporting the light emitting semiconductor layer while surrounding the light emitting semiconductor layer;
   a first passivation layer between a side of the light emitting semiconductor layer and the second electrode layer;
   a second passivation layer between the second electrode layer and the first passivation layer; and
   a light extraction structure on the first conductive semiconductor layer,
   wherein the light extraction structure has a plurality of holes or column shapes,
   wherein the first passivation layer comprises an inorganic layer,
   wherein the second passivation layer comprises an organic layer,
   wherein the holes or column shapes are formed on an entire area of the upper surface of the first conductive semiconductor layer, and
   wherein the first electrode layer directly contacts the holes or column shapes of the light extraction structure.

2. The light emitting device as claimed in claim 1, wherein the inorganic layer comprises one of SiN, $SiO_2$, or $TiO_2$.

3. The light emitting device as claimed in claim 1, wherein the first passivation layer comprises at least two first and second inorganic layers alternately disposed.

4. The light emitting device as claimed in claim 3, wherein the first inorganic layer comprises $SiO_2$ and the second inorganic layer comprises $TiO_2$.

5. The light emitting device as claimed in claim 1, wherein the second passivation layer comprises the organic layer containing at least one of acryl-based material, epoxy-based material, or polyimide-based material.

6. The light emitting device as claimed in claim 1, wherein the second electrode layer comprises an ohmic contact layer under the light emitting semiconductor layer, a bonding metal layer under the ohmic contact layer and the first passivation layer and at a side of the first passivation layer, and a support layer under the bonding metal layer and at a side of the bonding metal layer.

7. The light emitting device as claimed in claim 6, wherein the bonding metal layer and the support layer protrude toward the light emitting semiconductor layer.

8. The light emitting device as claimed in claim 1, further comprising:
   a metal layer under the light emitting semiconductor layer and the first passivation layer and at side of the first passivation layer.

9. The light emitting device as claimed in claim 1, wherein the first passivation layer extends to a bottom edge of the light emitting semiconductor layer.

10. The light emitting device as claimed in claim 1, wherein the metal layer is electrically connected with the light emitting semiconductor layer, and is electrically isolated from a lateral side of the light emitting semiconductor layer.

11. The light emitting device as claimed in claim 1, wherein the second passivation layer extends to a bottom edge of the metal layer.

12. The light emitting device as claimed in claim 1, wherein the inorganic layer comprises a first inorganic layer containing one of SiN, $SiO_2$, or $TiO_2$ and a second inorganic layer containing another one of SiN, $SiO_2$, or $TiO_2$.

13. The light emitting device as claimed in claim 8, wherein the metal layer comprises at least one of Ag, W, or Al.

14. A light emitting device comprising:
   a light emitting semiconductor layer comprising a first conductive semiconductor layer, a second conductive semiconductor layer, and an active layer between the first conductive semiconductor layer and the second conductive semiconductor layer;
   a first electrode layer on the light emitting semiconductor layer;
   a second electrode layer supporting the light emitting semiconductor layer;
   a first passivation layer on a side of the light emitting semiconductor layer;
   a second passivation layer on the first passivation layer, wherein a portion of the second passivation layer is disposed between the light emitting semiconductor layer and the second electrode layer; and
   a light extraction structure on the first conductive semiconductor layer,
   wherein the light extraction structure has a plurality of holes or column shapes,
   wherein the first passivation layer comprises an inorganic layer,
   wherein the second passivation layer comprises an organic layer, wherein the holes or column shapes are formed on an entire area of the upper surface of the first conductive semiconductor layer, and wherein the first electrode layer directly contacts the holes or column shapes of the light extraction structure.

15. The light emitting device as claimed in claim 14, wherein the first passivation layer comprises at least two first and second inorganic layers alternately disposed, and wherein a refractive index of the first inorganic layer is different from a refractive index of the second inorganic layer.

16. The light emitting device as claimed in claim 14, wherein the second passivation layer comprises the organic layer containing at least one of acryl-based material, epoxy-based material, or polyimide-based material.

17. The light emitting device as claimed in claim 14, further comprising:

an ohmic electrode layer contacted with the second conductive semiconductor layer.

18. The light emitting device as claimed in claim 17, wherein the ohmic electrode layer is disposed between the first passivation layer and the second passivation layer.

19. The light emitting device as claimed in claim 1, wherein the light extraction structure is a photonic crystal.

20. The light emitting device as claimed in claim 14, further comprising:

a metal layer under the light emitting semiconductor layer and the first passivation layer and at a side of the first passivation layer.

21. The light emitting device as claimed in claim 14, wherein the light extraction structure is a photonic crystal.

* * * * *